United States Patent [19]

Druschel et al.

[11] 4,014,576
[45] Mar. 29, 1977

[54] ARTICLE CARRIER

[75] Inventors: William O. Druschel, Granite Springs; Bayard G. Gardineer, Jr., Patterson; Stanley A. Manning, Yorktown Heights; Bela Musits, Wappingers Falls, all of N.Y.

[73] Assignee: International Business Machines Corporation, Armonk, N.Y.

[22] Filed: June 19, 1975

[21] Appl. No.: 588,530

[52] U.S. Cl. .................................. 302/31; 180/125; 214/1 BE; 302/2 R
[51] Int. Cl.² .................................. B65Q 51/02
[58] Field of Search ............... 104/23 FS; 214/1 R, 214/1 BE; 180/125; 302/2 R, 29, 31

[56] References Cited
UNITED STATES PATENTS

| | | | |
|---|---|---|---|
| 3,405,977 | 10/1968 | Albright | 302/29 |
| 3,419,164 | 12/1968 | O'Neill | 180/125 X |
| 3,513,934 | 5/1970 | Crowley | 180/125 X |
| 3,645,581 | 2/1972 | Lasch, Jr. et al. | 302/31 X |

FOREIGN PATENTS OR APPLICATIONS 2,149,060   4/1972   Germany .......................... 302/31

Primary Examiner—Frank E. Werner
Attorney, Agent, or Firm—Frank C. Leach, Jr.; Henry Powers

[57] ABSTRACT

A portable carrier for a semiconductor wafer is detachably connected to an air slide so that the wafer can be propelled from the carrier to the air slide and vice versa by air from the air slide. The carrier has a chamber with an air slide base on which the wafer is supported by air from the air slide when the wafer is to be propelled into or out of the chamber. The carrier has a single wafer port, which is sealed except when the carrier is connected to the air slide, through which the wafer enters or exits when propelled by air from the air slide. When the carrier chamber is sealed, the wafer is retained in position within the chamber by retaining means, which are rendered ineffective when the wafer is to be propelled into or out of the chamber.

12 Claims, 15 Drawing Figures

ARTICLE CARRIER

In air slides of the type shown and described in U.S. Pat. No. 3,706,475 to Yakubowksi, a semiconductor wafer is directed in a desired direction and supported by the same pressurized air. It is desired to be able to insert a semiconductor wafer in an air slide of the type shown and described in the aforesaid Yakubowski patent at various locations or to remove a waver therefrom at such locations.

It is necessary that the wafer be removed from or supplied to the air slide without the wafer being handled by a human being or exposed to the ambient air to avoid contamination of the wafer. It also is desired that the wafer be capable of being manually or automatically transported from the position at which it is removed from the air slide to another position of the air slide or to a storage area without any contamination thereof.

The present invention satisfactorily meets the foregoing conditions through providing a portable carrier within which the semiconductor wafer is sealed when disposed therein. Thus, the portable carrier of the present invention prevents any contamination of the wafer when it is disposed therein whereby the wafer can be manually or automatically transported to another position of the air slide or manually or automatically transported to a storage area.

To be able to supply the wafer to an air slide from the carrier or receiver the wafer from the air slide, it is necessary that there be suitable means for propelling or moving the waver without causing contamination thereof. The carrier of the present invention satisfactory solves this problem through utilizing the pressurized air employed with the air slide to propel the wafer into or out of the carrier.

By utilizing the air from the air slide to which the carrier is attached, it is not necessary for the carrier to have its own air supply as has been utilized in U.S. Pat. No. 3,174,645 to Barcia et al, for example. Accordingly, the carrier of the present invention is relatively lightweight and can be easily moved from one location of the air slide to another, for example.

An object of this invention is to provide a portable carrier for an article.

Another object of this invention is to provide a sealed carrier for an article.

A further object of this invention is to provide a carrier for an article in which the article is propelled into or out of the carrier by air.

Still another object of this invention is to provide a carrier for a semiconductor wafer so that the waver can be supplied to or removed from an air slide without any contamination of the wafer.

The foregoing and other objects, features, and advantages of the invention will be apparent from the following more particular description of preferred embodiments of the invention as illustrated in the accompanying drawings.

Figure 1:
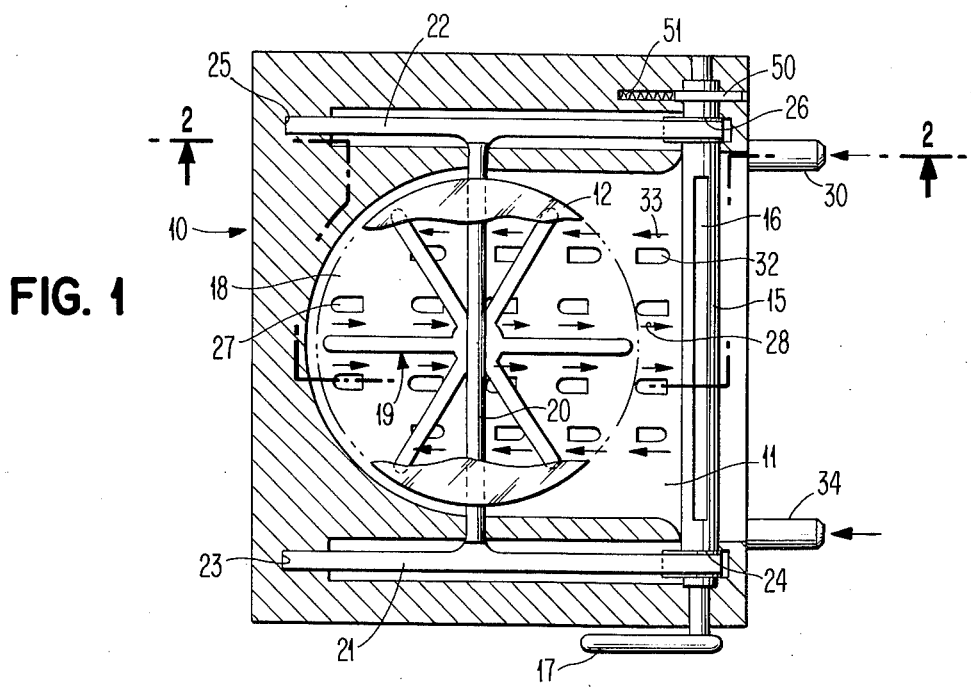
FIG. 1 is a sectional view of one form of the carrier of the present invention with an article disposed therein.
Figure 2:
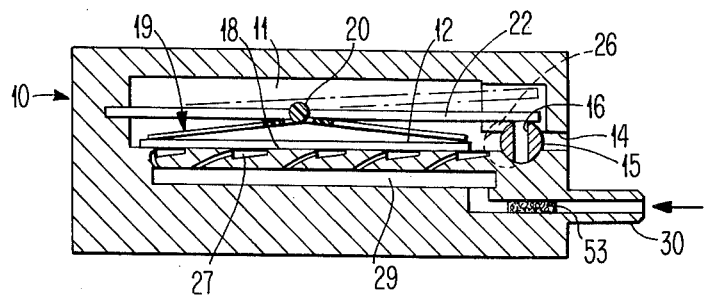
FIG. 2 is a sectional view, partly in elevation, of the carrier of FIG. 1 and taken along line 2—2 of FIG. 1.

Referring to the drawings and particularly FIGS. 1 and 2, there is shown a portable carrier 10 having a chamber 11 therein and within which is disposed an article 12 such as a semiconductor wafer, for example. The carrier 10 has an elongated port 14 in one of its walls and communicating with the chamber 11. The article 12 can enter or leave the chamber 11 of the carrier 10 through the port 14.

An entry seal 15, which is cylindrical shaped with an elongated opening 16 extending therethrough, is disposed to block the port 14 to seal the chamber 11. The seal 15 extends through the carrier 10 and is rotatably supported thereby. One end of the seal 15 has a handle 17 connected thereto to allow rotation of the seal 15 so that the seal 15 can be moved from its sealing position of FIG. 2 to an ineffective or non-sealing position in which the elongated opening 16 is aligned with the port 14 so that the seal 15 does not block the port 14.

The article 12 is held against an air slide base 18 of the chamber 11 by suitable retaining means such as a star-shaped spring 19, for example. The spring 19 is formed of a suitable plastic so as to not damage the article 12 when in engagement therewith.

The spring 19 has a shaft 20 connected thereto and extending exterior of each side of the chamber 11. One end of the shaft 20 is connected to a rod 21 intermediate the ends of the rod 21 while the other end is connected to a rod 22 intermediate the ends of the rod 22.

The rod 21 has one end disposed in a recess 23 in the carrier 10 and its other end cooperating with a cam 24 on the seal 15. The rod 22 has one end disposed in a recess 25 in the carrier 10 and its other end cooperating with a cam 26 on the seal 15. Accordingly, the rods 21 and 22 are cam followers.

When the handle 17 is rotated to rotate the seal 15 so that the seal 15 no longer blocks the port 14 through the elongated opening 16 being aligned with the port 14, the cams 24 and 26 cooperate with the rods 21 and 22, respectively, to render the retaining spring 19 ineffective. Thus, when the article 12 can be moved out of the chamber 11 of the carrier 10 or into the chamber 11 of the carrier 10 because the port 14 is not blocked by the seal 15, the retaining spring 19 is disposed so that it does not interfere with this movement.

The air slide base 18 of the chamber 11 has a set of air outlet ports or jets 27, which comprise two separate parallel rows as shown in FIG. 1, to permit air to be supplied therethrough in a direction to propel the article 12 out of the chamber 11 of the carrier 10. Thus, the pressurized air flows in the direction indicated by arrows 28 and in a manner such as that shown and described in the aforesaid Yakubowski patent. Pressurized air is supplied to the air outlet ports or jets 27 from a chamber 29 (see FIG. 2), which communicates with an air conduit 30.

Thus, when air is supplied through the air conduit 30, the article 12 is lifted from the base 18 and propelled out of the chamber 11 of the carrier 10. This can only occur when the air conduit 30 is connected to a source of air supply.

The air slide base 18 has a set of air inlet ports or jets 32 through which air is supplied to both lift the article 12 and direct it into the chamber 11 to the position shown in FIG. 1. The ports 32 supply the air in the direction indicated by arrows 33 in a manner such as that shown and described in the aforesaid Yakubowski patent.

As shown in FIG. 1, the ports 32 are disposed in parallel rows on opposite sides of the ports 27. Of course, any other suitable arrangement may be employed as long as the air from the ports 27 propels the article 12 out of the chamber 11 and the air from the ports 32 directs the article 12 into the chamber 11.

The air inlet ports or jets 32 communicate with a chamber (not shown) of the same type as the chamber 29 but disposed on each side of the chamber 29 and communicating with an air conduit 34. Thus, air must be supplied through the air conduit 34 for the air to be directed through the ports or jets 32.

Figure 3:
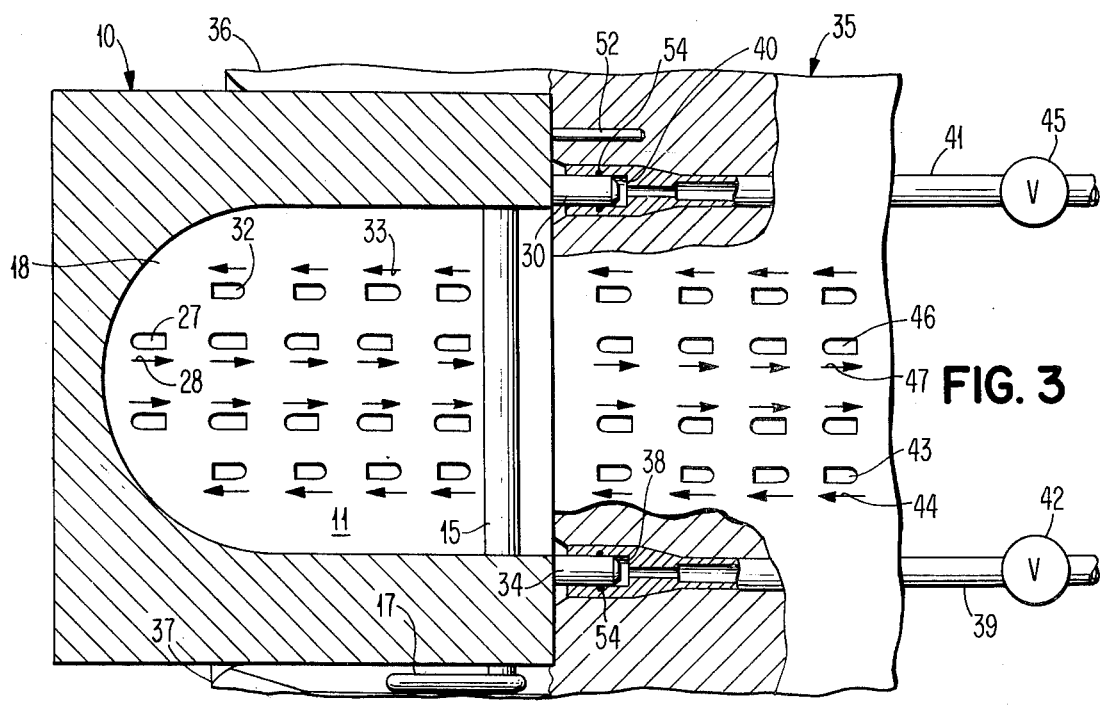
FIG. 3 is a top plan view, partly in section, showing the carrier of FIGS. 1 and 2 connected to a portion of an air slide.

As shown in FIG. 3, the carrier 10 is detachably connected to an air slide or track 35, which can be of the type shown and described in the aforesaid Yakubowski patent, for example. When the carrier 10 is to be detachably connected to the air slide or track 35, the carrier 10 is supported on a pair of substantially parallel guides 36 and 37 extending from the air slide or track 35.

When supported on the guides 36 and 37, the air conduit 34 of the carrier 10 is disposed in an enlarged receptacle 38 of an air supply line 39 of the air slide or track 35. Similarly, the air conduit 30 of the carrier 10 is disposed in a receptacle 40 of an air supply line 41 of the air slide or track 35.

The air supply line 39 has a valve 42 therein to control the flow of pressurized air to air inlet ports or jets 43, which direct the air in the direction indicated by arrows 44 in the air slide or track 35. This is the same direction in which the air is directed from the air ports or jets 32 in the air slide base 18 of the carrier 10 to propel the article 12 into the chamber 11.

Air supplied through the air supply line 41 is controlled by a valve 45. The pressurized air is supplied from the air supply line 41 to air outlet ports or jets 46 in the air slide or track 35 to direct the air in the direction of arrows 47. This is in the same direction as the air is supplied through the air conduit 30 to the air outlet ports or jets 27 in the air slide base 18 of the chamber 11 of the carrier 10 whereby the air propels the article 12 out of the chamber 11 of the carrier 10.

Thus, whenever the valve 42 is opened, pressurized air is supplied to both the air slide or track 35 and the carrier 10 simultaneously to move the article 12 into the carrier 10. Similarly, when the valve 45 is opened, pressurized air is supplied simultaneously to both the air slide or track 35 and the carrier 10 to propel the article 12 out of the chamber 11 of the carrier 10 to the air slide or track 35.

When the article 12 is propelled from the chamber 11 of the carrier 10 to the air slide or track 35 by opening the valve 45, the article 12 can be directed from the air slide or track 35 to a main air slide or track (not shown) with which the air slide or track 35 cooperates. It should be understood that the air slide or track 35 has a cover or top (not shown) so that it is enclosed whereby there is not contamination of the article 12.

The end of the air slide or track 35 has an opening of substantially the same size as the port 14 in the carrier 10 to enable the article 12 to enter the air track 35 from the carrier 10 or to be removed therefrom to the carrier 10. The opening is relatively small and the constant pressure head of the air slide or track 35 prevents any contaminating air from entering the air slide or track 35 through the end opening, which communicates with the port 14 when the carrier 10 is supported on the guides 36 and 37 as shown in FIG. 3.

The carrier 10 has an interlock 50 (see FIG. 1) for cooperation with the seal 15 to prevent rotation thereof by the hand 17 unless the carrier 10 is supported on the guides 36 and 37 of the air slide or track 35, the air conduit 34 is in the receptacle 38 of the air supply line 39, and the air conduit 30 is in the receptacle 40 of the air supply line 41.

When the carrier 10 is so positioned, the interlock 50 is moved against the force of a spring 51, which urges the interlock 50 to the position in which it prevents rotation of the seal 15 by having a flat surface of the interlock 50 engage a slot in the seal 15, for example, by an interlock actuator 52 (see FIG. 3) on the air slide or track 35. Accordingly, when the carrier 10 is properly disposed on the guides 36 and 37 and has the desired air connections so that pressurized air can be supplied to the air slide base 18 of the chamber 11, the interlock 50 is rendered ineffective by the actuator 52 through having an arcuate portion, for example, of the interlock 50 move over the slot in the seal 15 so that the seal 15 can rotate. The handle 17 can then be rotated to rotate the seal 15 away from blocking the port 14 of the carrier 10 and cause the elongated opening 16 in the seal 15 to align with the port 14 of the carrier 10.

To seal the chamber 11 of the carrier 10, it is necessary that each of the conduits 30 and 34 has a filter 53 (see FIG. 2) therein. This prevents contamination of the chamber 11 when the conduits 30 and 34 are not connected to the air supply lines 41 and 39, respectively. When the conduits 30 and 34 are connected to the air supply lines 41 and 39, respectively, a seal 54 (see FIG. 3) in the wall of each of the receptacles 40 and 38 of the air supply lines 41 and 39 engages each of the conduits 30 and 34.

Considering the operation of the embodiment of FIGS. 1-3, the carrier 10 has one of the articles 12 retained in the chamber 11 in the desired position by the retainer spring 19. When the article 12 in the carrier 10 is to be directed from the chamber 11 to the air slide or track 35, which forms part of the main air slide to which it is connected, the carrier 10 is disposed on the guides 36 and 37 as shown in FIG. 3. In this position, the air supply line 39 connects with the air conduit 34 and the air supply line 41 connects the air conduit 30. Furthermore, the actuator 52 renders the interlock 50 ineffective.

Accordingly, the handle 17 is rotated to rotate the seal 15 so that it no longer blocks the port 14. Then, the valve 45, which is controlled by a computer, for example, so as to have the article 12 supplied from the carrier 10 to the air slide 35 at the desired time, is opened to allow pressurized air to be supplied to the air outlet ports or jets 27 in the air slide base 18 of the chamber 11 of the carrier 10 and to the air outlet ports or jets 46 of the air slide or track 35. This pressurized air advances the article 12 from the chamber 11 of the carrier 10 to the air slide or track 35 from which it is advanced to the main air slide or track by the pressurized air supplied through the ports or jets 46 and corresponding ports in the main air slide or track.

When processing of the article 12, which has been supplied to the air slide or track 35, is finished or another of the articles 12 is to be directed to the carrier 10 from the air slide or track 35, the valve 45 is inactivated and the valve 42 is opened. As a result, the article 12 is advanced from the air slide or track 35 to the chamber 11 of the carrier 10. Then, the handle 17 is rotated to return the seal 15 to its sealing position in which it blocks the port 14. Then, the carrier 10 can be removed from the guides 36 and 37 manually or automatically and transported manually or automatically to any desired location.

Referring to FIGS. 4-7, there is shown a carrier 60 in which the retaining spring 19 and the rotary seal 15 are not utilized. Thus, when using the carrier 60 with an air slide or track 61, which has the carrier 60 detachably connected thereto, there is no necessity for any type of interlock actuator.

The carrier 60 has a chamber 62 within which the article 12 is disposed on an air slide base 63, which forms the bottom of the chamber 62. The carrier 60 has a port 64 (see FIGS. 6 and 7) through which the article 12 can be removed from or supplied to the chamber 62.

Figure 6:
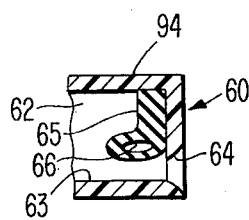
FIG. 6 is a fragmentary sectional view of a portion of the carrier of FIG. 4 and showing its entry seal in its ineffective position.
Figure 7:
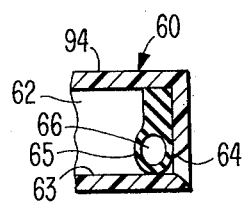
FIG. 7 is a fragmentary sectional view of a portion of the carrier of FIG. 4 and similar to FIG. 6 but showing the entry seal in its sealing position.

A seal 65, which is formed of a suitable resilient material such as rubber, for example, is utilized to close the port 64. The seal 65 has a passage 66 therein having one end to which a vacuum can be applied from a vacuum conduit 67 (see FIG. 4) and its other end closed. When a vacuum is applied to the passage 66, the cross sectional area of the passage 66 changes from a substantially circular or elliptical shape to a substantially horizontal shape through collapsing of the seal 65 to cause the seal 65 to be moved from its blocking position of FIG. 7 in which it effectively seals the port 64 to a position in which it does not block the port 64 as shown in FIG. 6.

Thus, the seal 65 can be rendered effective only when a vacuum is applied to the passage 66 from the vacuum conduit 67. This can occur only when the carrier 60 is supported on a guide bracket 68 (see FIG. 5), which is secured to the air slide or track 61 by screws 68', for connection to the air slide or track 61.

The air slide base 63 of the chamber 62 has a set of air inlet ports or jets 69 formed along a central longitudinal axis thereof to permit air to be supplied therethrough in a direction to propel the article 12 into the chamber 62 of the carrier 60. Pressurized air is supplied to the air inlet ports or jets 69 from an air conduit 70. Thus, when pressurized air is supplied through the air conduit 70, the article 12 is held in spaced relation to the air slide base 63 and propelled into the chamber 62 of the carrier 60. This can occur only when the air conduit 70 is connected to a source of air pressure.

Figure 4:
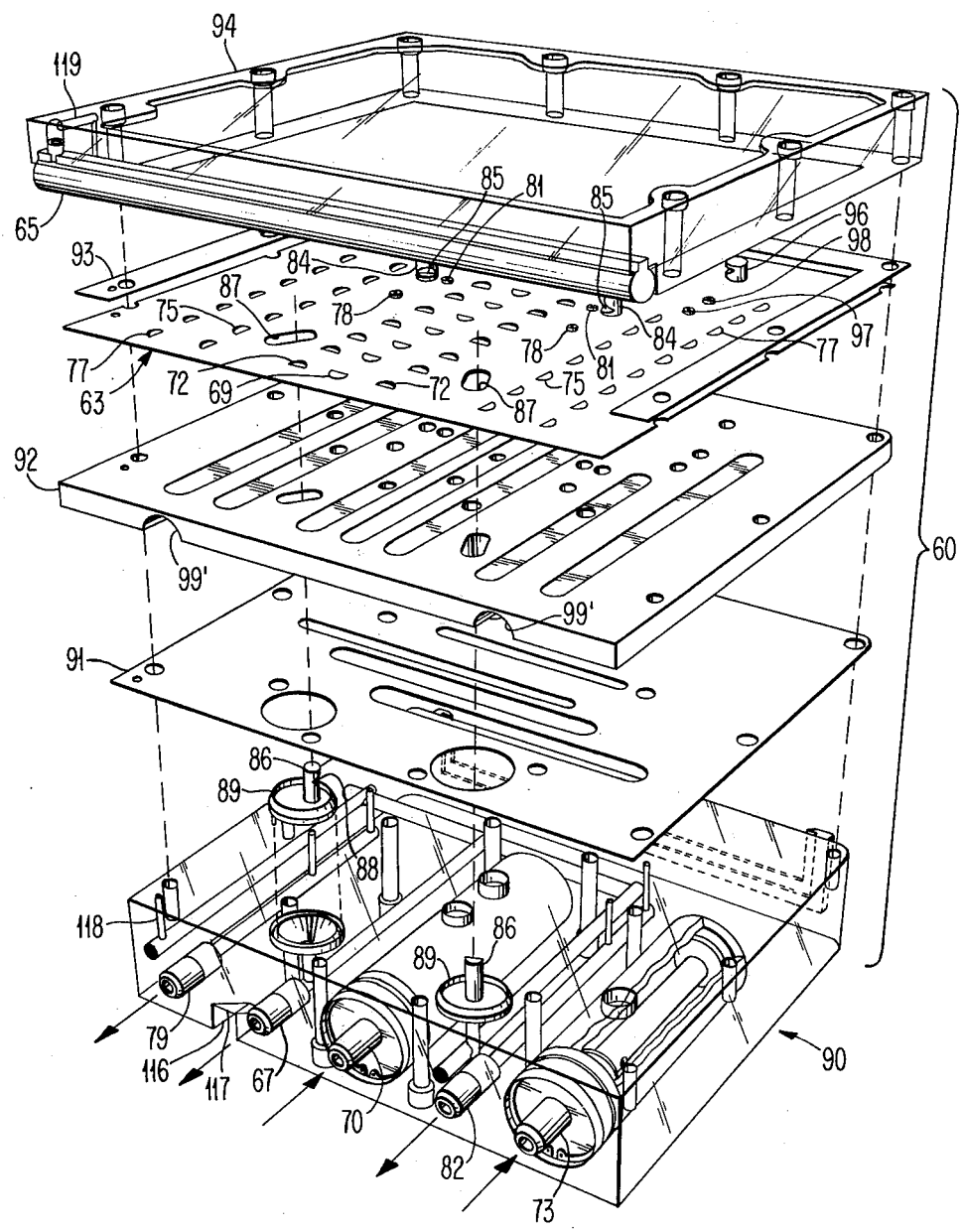
FIG. 4 is an exploded perspective view of another embodiment of the carrier of the present invention.

The air slide base 63 has a set of air outlet ports or jets 72 through which air is supplied in a direction to propel the article 12 out of the chamber 62 of the carrier 60 while holding the article 12 in spaced relation to the air slide base 63. As shown in FIG. 4, the air outlet ports or jets 72 are disposed in two substantially parallel rows with a row on each side of the row of the ports 69 and substantially parallel thereto. Since there is only the single row of the ports 69 and two of the rows of the ports 72, the ports 69 can continuously supply air when the carrier 60 is connected to the air slide or track 61 since the increased pressure produced by the two rows of the ports 72 overcomes the pressurized air from the ports 69 to propel the article 12 out of the carrier 60. Any other suitable arrangement may be employed as long as the air from the ports 72 propels the article 12 out of the chamber 62 and the air from the ports 69 directs the article 12 into the chamber 62.

The ports 72 are connected to an air conduit 73 to enable pressurized air to be supplied to the ports 72. This can occur only when the conduit 73 is connected to a source of air pressure.

As shown in FIG. 4, the air slide base 63 has a first set of air centering ports or jets 75 disposed in a pair of substantially parallel rows on the outer side of each of the two rows of the air outlet ports or jets 72 and substantially parallel thereto. The air centering ports 75 are connected to the conduit 70 since the conduit 70 continuously supplies pressurized air to the connected ports 69. Thus, the centering ports 75 have air supplied thereto whenever air is supplied to the carrier 60. The ports 75 direct the streams of pressurized air toward each other while also aiding in supporting the article 12 in spaced relation to the air slide base 63.

The air slide base 63 has a second set of air centering ports or jets 77 formed in two substantially parallel rows with each of the rows of the air centering ports 77 being outside of one of the rows of the ports 75 and substantially parallel thereto. The air centering ports 77 also are connected to the conduit 70 in the same manner as the air centering ports 75.

The air centering ports 75 are utilized to center the article 12 only when it has a predetermined size such as 2¼ inches in diameter, for example. The air centering ports 77 are employed only when the article 12 has a predetermoned larger size such as 3¼ inches in diameter, for example. Thus, only one of the sets of the ports 75 and 77 is utilized.

It should be understood that the carrier 60 is designed for utilization with the article 12 having a predetermined size. That is, the carrier 60 is designed to handle only the article 12 of 2¼ inches diameter or only the article 12 of 3¼ inches diameter. Thus, if the article 12 is of smaller diameter, then the ports 77 are not connected to the conduit 70 even though they are formed in the air slide base 63. Likewise, if the article 12 is of larger diameter, then the air centering ports 75 are not connected to the conduit 70 even though they are formed in the air slide base 63.

The air slide base 63 has a first pair of vacuum stops 78 formed therein for cooperation with the article 12 when it is of the smaller size. A vacuum is applied to the vacuum stops 78 from a vacuum conduit 79. Thus, when a vacuum is applied to the vacuum conduit 79, the vacuum applied to the vacuum stops 78 slows down the motion of the article 12 as it is propelled into the chamber 62 of the carrier 60 by the air ports or jets 69.

The air slide base 63 has a second pair of vacuum stops 81 disposed rearwardly of the vacuum stops 78 in the direction of entry of the article 12 into the chamber 62 and slightly inside of the vacuum stops 78 (see FIG. 4). The second pair of vacuum stops 81 is connected to a vacuum conduit 82 through which a vacuum is applied to the vacuum stops 81 to stop the article 12 when the article 12 is of the smaller size.

When the article 12 is of the smaller size, a pair of retaining pins 84 is mounted on the air slide base 63. Each of the pins 84 has a slot 85 therein to receive the edge of the article 12.

After the article 12 is stopped by the vacuum stops 81 so that the edge of the article 12 is disposed in the slots 85 in the retaining pins 84, a pair of retractable pins 86 is moved upwardly through openings 87 in the air slide base 63 so that a slot 88 in each of the pins 86 receives the edge of the article 12. Each of the retractable pins 86 is formed integral with a diaphragm 89, which has a vacuum applied thereto from the vacuum conduit 67. Thus, the pins 86 do not engage the article 12 except when the seal 65 is returned to its closed position to seal the port 64 of the chamber 62 of the carier 60. The retractable pins 86 function in the manner more particularly shown and described in the copending patent application of Bernd Cruse for Article Handling Device, Ser. No. 588,531, filed June 19, 1975, and assigned to the same assignee as the assignee of this application.

As shown in FIG. 4, the conduits 67, 70, 73, 79, and 82 are supported in a base 90 upon which is mounted an air and vacuum distribution gasket 91. The distribution gasket 91 cooperates with outlets from the conduits 67, 70, 73, 79, and 82 to control where the vacuum and air pressure are directed through an intermediae plate 92, which is disposed above the gasket 91 and beneath the air slide base 63, to the various ports in the air slide base 63.

The air slide base 63 has a gasket 93 disposed between the top surface of the gasket 93 and a cover 94, which has an open bottom to form the chamber 62 of the carrier 60 between the cover 94 and the air slide base 63, around all of the sides of the air slide base 63 except for the side having the port 64. The seal 65 seals between the cover 94 and the air slide base 63 at the port 64.

Figure 5:
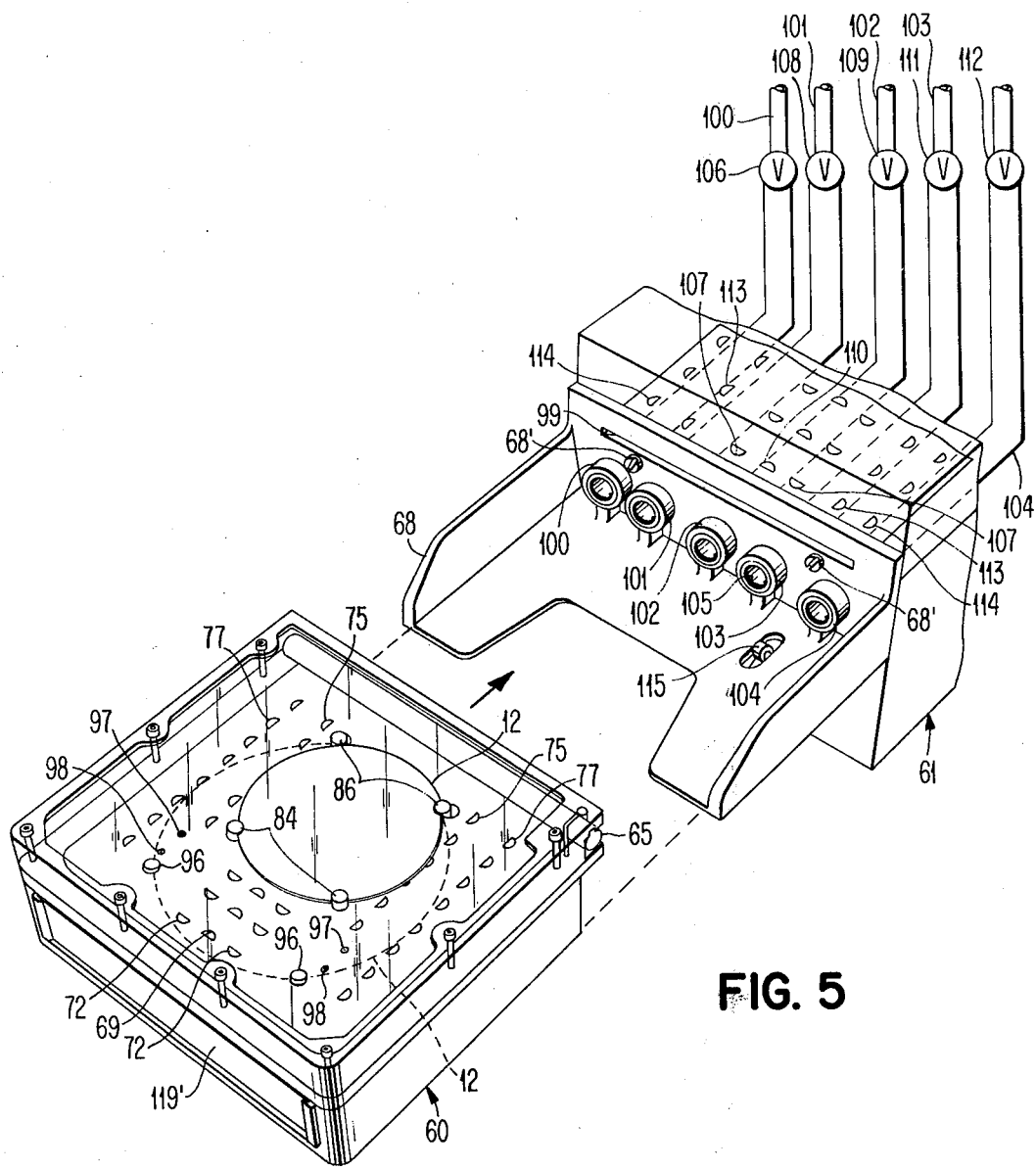
FIG. 5 is a perspective view, partly schematic, showing the carrier of FIG. 4 and a portion of the air slide to which it is connected to enable an article to be moved between the carrier and the air slide.

When the article 12 is to be of the larger diameter as indicated in phantom lines in FIG. 5, the retaining pins 84 are not utilized. Instead, a pair of retaining pins 96, which have the same configuration as the pins 84, is disposed to engage the edge of the article 12 further from the port 64 than the pins 84.

The pins 96 have a first pair of vacuum stops 97 in the air slide base 63 disposed further therefrom than a second pair of vacuum stops 98 in the air slide base 63. The vacuum stops 97 are connected to the vacuum conduit 79, and the vacuum stops 98 are connected to the vacuum conduit 82. Thus, each pair of the vacuum stops 97 and 98 is effective only when a vacuum is applied thereto from the vacuum conduits 79 and 82, respectively.

It should be understood that the vacuum stops 78 and 81 are effective only when the article 12 is a smaller diameter. Similarly, the vacuum stops 97 and 89 are utilized only when the article 12 is of the larger diameter.

The distribution gasket 91 is designed in accordance with whether the article 12 is to be of the smaller or larger diameter. Thus, when the article 12 is of the smaller diameter, the distribution gasket 91 allows the vacuum conduit 79 to be connected to the vacuum stops 78 and the vacuum conduit 82 to be connected to the vacuum stops 81. When the article 12 is of the larger diameter, the distribution gasket 91 has a configuration to permit the vacuum conduit 79 to connect only to the vacuum stops 97 and the vacuum conduit 82 to be in communication only with the vacuum stops 98. FIG. 4 shows the distribution gasket 91 for use with the article 12 of smaller diameter.

The carrier 60 is adapted to be detachably connected to the air slide or track 61 (see FIG. 5), which can be of the type shown and described in the aforesaid Yakubowski patent, for example. When the carrier 60 is to be detachably connected to the air slide or track 61, the carrier 60 is supported on the bracket 68 of the air slide or track 61. The air slide or track 61 has an entry slot or opening 99 through which the article 12 can enter or leave the air slide or track 61. The intermediate plate 92 of the carrier 60 has semi-circular slots 99' to fit over the heads of the screws 68' when the carrier 60 is supported on the bracket 68 of the air slide or track 61.

When supported on the bracket 68, the air conduit 73 is connected to an air conduit 100, the vacuum conduit 82 is connected to a vacuum conduit 101, the air conduit 70 is connected to an air conduit 102, the vacuum conduit 67 is connected to a vacuum conduit 103, and the vacuum conduit 79 is connected to a vacuum conduit 104. Each of the conduits 100-104 has a seal 105 formed therein to engage the outer surface of the conduit received therein when the carrier 60 is disposed on the bracket 68. Thus, the carrier 60 is locked to the air slide or track 61 by the tight fit of the conduits 73, 82, 70, 67, and 79 in the conduits 100–104, respectively.

The conduit 100 has a valve 106 therein to control the flow of pressurized air to air outlet ports or jets 107 in the air slide or track 61. The pressurized air supplied through the ports 107 is supplied in the same direction in which air is directed from the air outlet ports or jets 72 in the air slide base 63 of the carrier 60. Thus, the air supplied through the conduit 100 causes the article 12 to be propelled from the carrier 60 to the air slide 61 and from the air slide or track 61 to the main air slide or track to which the air slide or track 61 is connected.

The vacuum conduit 101 has a valve 108 therein to control when vacuum is applied to the connected vacuum conduit 82. This is when the article 12 is to be stopped by the second pair of the vacuum stops 81 or 98.

The flow of pressurized air through the air conduit 102 is controlled by a valve 109. The pressurized air is supplied from the conduit 102 to air inlet ports or jets 110 in the air slide or track 61 to direct the pressurized air in the same direction as pressurized air is directed through the ports 69 in the air slide base 63 of the carrier 60. This is a direction to propel the article 12 into the chamber 62 of the carrier 60.

A valve 111 controls the application of a vacuum through the vacuum conduit 103. This is the vacuum applied to the vacuum conduit 67 of the carrier 60 to move the seal 65 to its open position so that it does not block the port 64 and to render the retractable pins 86 ineffective by retracting them in the manner more particularly shown and described in the aforesaid Cruse application.

The conduit 104 has a valve 112 to determine when a vacuum is applied thereto to apply a vacuum to the vacuum conduit 79 of the carrier 60. This occurs when the first pair of the vacuum stops 78 or 97 is to be effective to aid in stopping the motion of the article 12 into the chamber 62 of the carrier 60.

The air slide or track 61 also has a first set of air centering ports or jets 113. These are employed whenever the ports or jets 75 are utilized. This is when the article 12 is of the smaller size.

The air slide or track 61 has a second set of air centering ports or jets 114, which are utilized whenever the air centering ports or jets 77 of the carrier 60 are employed. This is when the article 12 is of the larger size. The air ports 113 and 114 are connected to the conduit 102.

Considering the operation of the embodiment of FIGS. 4-7, the carrier 60 has one of the articles 12 retained in the chamber 62 in the deired position by the retractable pins 86 and the retaining pins 84 or 96 depending on whether the carrier 60 is to be used for the article 12 of small or large size. Thus, the pins 96 are supported in the air slide base 63 of the carrier 60 only when the article 12 is of the larger diameter, and the pins 84 are mounted in the air slide base of the carrier 60 only when the article 12 is of the smaller diameter.

When the article 12 of the carrier 60 is to be directed from the chamber 62 to the air slide or track 61, the carrier 60 is disposed on the bracket 68. In this position, the conduits 73, 82, 70, 67, and 79 connect with the conduits 100-104, respectively.

When the carrier 60 is disposed on the bracket 68 so that the conduits 73, 82, 70, 67, and 79 are connected to the conduits 100-104, respectively, a switch 115 (see FIG. 5) is activated by the carrier 60. The carrier 60 has a slot 116 (see FIG. 4) with a cam surface 117 in the base 90 to insure that the carrier 60 is fully mounted on the bracket 68 before the switch 115 is activated. It is necessary for the switch 115 to be activated to provide a signal to enable any of the valves 106, 108, 109, 111, and 112 of the conduits 100-104, respectively, to be opened.

With the carrier 60 mounted on the bracket 68 so that the switch 115 is activated, any of the valves 106, 108, 109, 111, and 112 can be opened or closed by suitable control means such as a computer, for example. since the air centering ports 75 or 77 must have the air supplied thereto prior to the article 12 being removed from the carrier 60, it is necessary for the valve 109 to be opened to enable air to be supplied to the air ports 69 in the air slide base 63 of the chamber 62 of the carrier 60 so that either the air centering ports 75 or 77 also receive the pressurized air. The opening of the valve 109 also supplies air to the air ports 110 and the air centering ports 113 or 114 of the air slide or track 61.

To remove the article 12 from the carrier 60 to the air slide or track 61, it is necessary to open the valve 111 in the vacuum conduit 103. This applies a vacuum from the vacuum conduit 67 to simultaneously retract the pins 86 and move the entry seal 65 to its open position of FIG. 6. The entry seal 65 has its passage 66 connected to the vacuum conduit 67 through a line 118 (see FIG. 4) and a passage 119 in the cover 94.

At this time, the valve 106 (see FIG. 5) in the conduit 100 is opened while the valve 108 in the conduit 101 and the valve 112 in the conduit 104 remain closed. Thus, the vacuum stops 78 and 81 or 97 and 98 are not activated, but the air ports 72 for propelling the article 12 out of the carrier 60 are receiving pressurized air as are the air ports 69 for propelling the article 12 into the carrier 60 to continue to supply air to the air centering ports 75 or 77. However, as previously mentioned, because of the two rows of the ports 72 in comparison with the single row of the ports 69, the pressurized air through the ports 72 produces a greater force to propel the article 12 from the chamber 62 of the carrier 60 to the air slide or track 61.

The opening of the valve 106 of the conduit 100 also supplies pressurized air through the ports 107 to aid in propelling the article 12 from the air slide or track 61 to the main air slide or track. There are two rows of the air ports 107 and only the single row of the air ports 110 so that the pressurized air through the ports 107 produces a greater force than that produced by the ports 110 to move the article 12 from the air slide or track 61 to the main air slide or track.

Accordingly, with the seal 65 in its open position so that the port 64 is not blocked and the pins 86 retracted, the pressurized air from the air ports 72 advances the article 12 from the chamber 62 of the carrier 60 to the air slide 61 from which it is advanced to the main air slide or track by the pressurized air supplied through the air ports 107 and corresponding ports in the main air slide or track. When the presence of the article 12 is sensed in the main air slide or track by suitable means, the valve 106 in the conduit 100 is closed to stop supply of pressurized air to the air ports 72 and 107. The valve 109 in the conduit 102 and the valve 111 in the vacuum conduit 103 also are closed. The closing of the valve 109 in the conduit 102 stops the supply of air to the ports 69 and 110 and the air centering ports 75 or 77 and the air centering ports 113 or 114. The closing of the valve 111 in the vacuum conduit 103 causes the seal 65 to return to its closed position of FIG. 7 and the pins 86 to return to their retaining position.

When processing of the article 12, which has been supplied from the carrier 60, is finished or another of the articles 12 is to be directed to the carrier 60 from the air slide or track 61, the valve 109 in the conduit 102 and the valve 111 in the vacuum conduit 103 are opened. The opening of the valve 111 enables a vacuum to be applied to the vacuum conduit 67 to simultaneously retract the pins 86 and move the seal 65 to its open position of FIG. 6. The opening of the valve 109 in the conduit 102 causes supply of air to the air inlet ports 69 and 110 and to the air centering ports 75 or 77 and the air centering ports 113 or 114.

At the time that propelling of the article 12 from the air slide or track 61 into the carrier 60 is to occur, vacuum stops (not shown), for example, in the air slide 61 are inactivated and the vacuum stops 78, if the carrier 60 is used for the article 12 of smaller size, or the vacuum stops 97, if the carrier 60 handles the article 12 of larger size, has a vacuum applied thereto through opening the valve 112 in the conduit 104.

Therefore, as the article 12 is advanced from the air slide or track 61 to the chamber 62 of the carrier 60, its motion is slowed or stopped by the vacuum stops 78 or 97. The vacuum stops 81 or 98, depending on the size of the article 12 that the carrier 60 is to transport, are then activated through opening the valve 108 in the conduit 101. This activation can occur, for example, a predetermined period of time after the first pair of the vacuum stops 78 or 97 has been activated or when a vacuum sensor has sensed that the article 12 has arrived at the vacuum stops 78 or 97.

After the vacuum stops 81 or 98 have a vacuum applied thereto through opening the valve 108 in the conduit 101 and the vacuum is removed from the vacuum stops 78 or 97 through closing the valve 112 in the conduit 104, the retractable pins 86 must be moved upwardly to hold the article 12 in cooperation with the retaining pins 84 or 96 depending on the size of the article 12 that the carrier 60 is to transport. This is accomplished through closing the valve 111 in the conduit 103 to stop the application of vacuum through the conduit 67 to the diaphragms 89. The stopping of the application of the vacuum through the vacuum conduit 67 also simultaneously causes the seal 65 to return to its closed position of FIG. 7.

When the valve 111 in the conduit 103 is closed, the valve 108 in the vacuum conduit 101 also is closed. Thus, this removes the vacuum from the vacuum stops 81 or 98 when the vacuum is removed from the vacuum conduit 67 to cause the retractable pins 86 to cooperate with the retaining pins 84 or 96 to hold the article 12 in a fixed position above the air slide base 63.

After the article 12 is retained between the pins 86 and the pins 84 or 96, the valve 109 in the conduit 102 is closed. This stops the supply of pressurized air to the ports 69 and the centering ports 75 and 77 in the carrier 60 and the ports 110 and the centering ports 113 or 114 in the air slide or track 61.

With the seal 65 in its closed position and the article 12 held between the retractable pins 86 and the retaining pins 84 or 96, the article 12 is retained within the carrier 60 so that the carrier 60 can be removed from the bracket 68 manually or automatically and transported to any desired location. When the carrier 60 is removed from the bracket 68, the switch 115 senses this removal to prevent any of the valves 106, 108, 109, 111, and 112 of the conduits 100–104, respectively, from being opened.

It should be understood that each of the conduits 67, 70, 73, 79, and 82 has a filter therein to prevent any contamination of the chamber 62 of the carrier 60 when the conduits 73, 82, 70, 67, and 79 are not connected to the conduits 100–104, respectively. This insures that the chamber 62 is sealed.

It should be understood that the carrier 60 may have an identification label 119' mounted on one of the walls of the base 90 of the carrier 60 as shown in FIG. 5. The label 119' allows the carrier 60 to be machine readable so that the carrier 60 can be properly disposed on the bracket 68 at the desired time through an automatic control arrangement.

Referring to FIGS. 8–15, there is shown a carrier 120 having the same configuration as the carrier 10 except that the retaining spring 19 and the rotary seal 15 are not utilized. Thus, there is no necessity for any type of interlock actuator with the air slide or track 35 when using the carrier 120.

The carrier 120 has a chamber 121, which is the same as the chamber 11, and within which the article 12 is disposed on an air slide base 122 thereof. The carrier 120 has a port 123 through which the article 12 can be removed from or supplied to the chamber 121.

Figure 8:
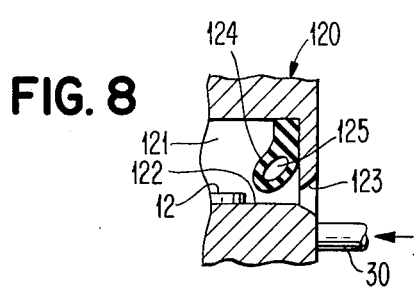
FIG. 8 is a fragmentary sectional view of a portion of the carrier of the present invention having another form of seal with the seal in its ineffective position and taken along line 8—8 of FIG. 9.
Figure 9:
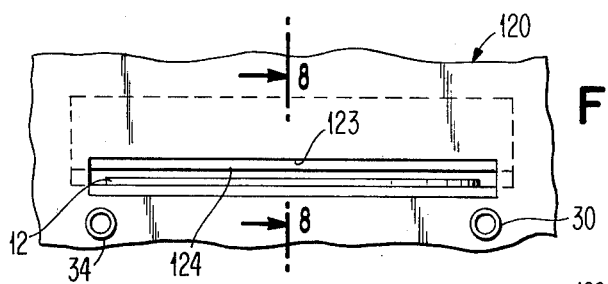
FIG. 9 is a front elevational view of a portion of the carrier of FIG. 8 and showing the seal in its ineffective position.
Figure 10:
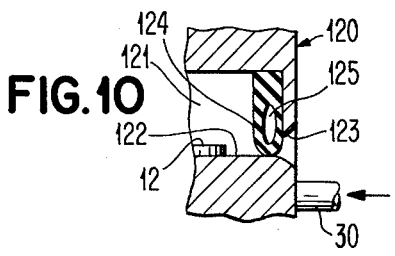
FIG. 10 is a fragmentary sectional view of a portion of the carrier and similar to FIG. 8 but showing the seal in its sealing position and taken along line 10—10 of FIG. 11.
Figure 11:
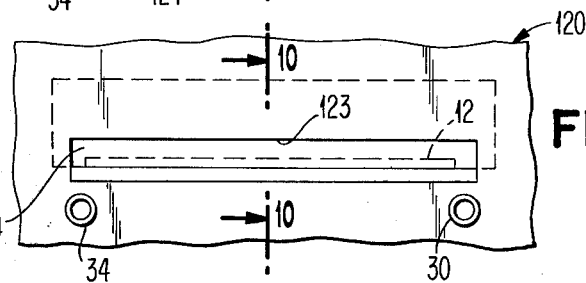
FIG. 11 is a front elevational view of a portion of the carrier and similar to FIG. 9 but showing the seal in its sealing position.
Figure 12:
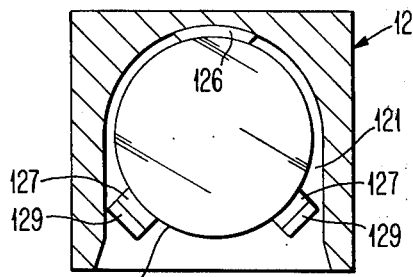
FIG. 12 is a schematic top plan view of the carrier having the seal of FIGS. 8–11 with the seal removed.

A seal 124, which is formed of a suitable resilient or elastic material such as rubber, for example, is utilized to close the port 123. The seal 124 has a passage 125 therein having one end to which pressurized air can be supplied through either of the air conduits 30 and 34 and its other end closed. When air is supplied to the passage 125, the cross sectional area of the passage 125 expands to cause the seal 124 to be moved from its blocking position of FIGS. 10 and 11 in which it effectively seals the port 123 to a position in which it does not block the port 123 as shown in FIGS. 8 and 9.

Thus, the seal 124 can be rendered ineffective only when there is pressurized air being supplied to the carrier 120. This is when the carrier 120 is supported on the guides 36 and 37 of the air slide or track 35 in the same manner as the carrier 10 is supported.

Thus, the interlock actuator 52 is not utilized when the carrier 120 is employed in place of the carrier 10. Of course, the air conduits 30 and 34 of the carrier 120 are the same as the air conduits 30 and 34 of the carrier 10.

In place of the spring 19 and its actuating mechanism, the article 12 is retained between a stationary bumper 126 (see FIG. 12) in the portion of the chamber 121 remote from the port 123 and a pair of movable retainers 127, which are angularly spaced from each other and the bumper 126. The bumper 126 and the retainers 127 are formed of a suitable resilient or elastic material such as rubber, for example.

Figure 13:
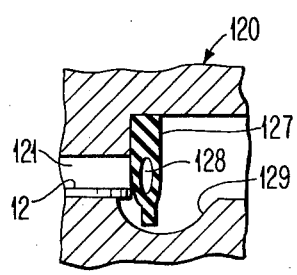
FIG. 13 is a fragmentary sectional view of one of the retainers used in the carrier of FIG. 12 with the retainer in its retaining position.
Figure 14:
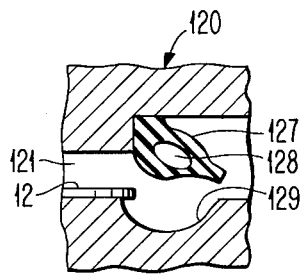
FIG. 14 is a fragmentary sectional view of one of the retainers and similar to FIG. 13 but showing the retainer in its ineffective position.

As shown in FIGS. 13 and 14, each of the retainers 127 has a passage 128 extending therethrough with one end closed. Whenever air is supplied to the open end of the passage 128 in each of the retainers 127, the retainer 127 moves from the position of FIG. 13 in which the retainers 127 engage the end of the article 12 to the position of FIG. 14 in which it does not retain the article 12 so that the article 12 can be advanced from the chamber 121 to the air slide or track 35 or vice versa.

The carrier 120 has a pair of recesses 129 therein for cooperation with the lower end of the retainers 127. The lower end of the retainer 127 extends into the cooperating recess 129 when the retainer 127 is retaining the article 12 against the bumper 126. Each of the recesses 129 has a curved or arcuate bottom so that swinging motion of the retainer 127 in moving between the positions of FIGS. 13 and 14 is not prevented.

The chamber 120 has the air outlet ports or jets 27, which are connected to the air conduit 30, in the air slide base 122 of the chamber 121 in the same manner as the jets 27 are in the air slide base 18 of the chamber 11 of the carrier 10. Likewise, the air slide base 122 has the air inlet ports or jets 32, which are connected to the air conduit 34.

Figure 15:
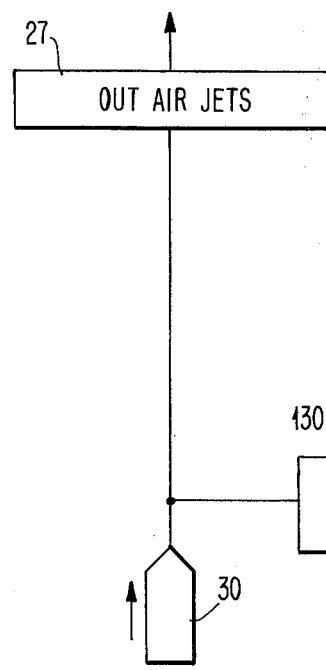
FIG. 15 is a schematic diagram showing the supply of air to the carrier of FIG. 12 from the air slide.

The schematic connection of the air conduit 30 to the air jets 27 and the air conduit 34 to the air jets 32 is shown in FIG. 15. Each of these air conduits 30 and 34 is connected to a shuttle valve 130, which is responsive to the pressure in either of the lines to allow the air to be supplied through the shuttle valve 130 to the passage 125 in the seal 124 and to the passage 128 in each of the retainers 127.

The shuttle valve 130 prevents any communication between the air conduits 30 and 34. This insures that the pressurized air is not supplied to the wrong set of the ports or jets 27 and 32 when it is also being supplied to the passage 125 in the seal 124 and the passage 128 in each of the retainers 127.

The carrier 120 cannot receive pressurized air until the carrier 120 is supported on the guides 36 and 36 of the air slide or track 35 in the same manner as the carrier 10. Of course, once pressurized air is supplied through opening of either the valve 42 and 45, the seal 124 is rendered ineffective and the retainers 127 are removed so that the article 12 can be easily and quickly propelled therefrom or one of the articles 12 can be supplied thereto if the carrier chamber 121 is empty.

If desired, the carrier 120 could have a pair of the bumpers 126 with the seal 124 and the movable retainers 127 replaced by a single inflatable member. In this arrangement, the retainers 127 would actually be replaced by the seal 124 so that the seal 124 would be mounted to engage the edge of the article 12 to retain it within the chamber 121 while also sealing the port 123.

While the present invention has described the article 12 as being a semiconductor wafer, it should be understood that the article 12 may be any article which it is desired to transport by an air stream. Thus it is not necessary to seal the chamber 11 in the carrier 10, the chamber 62 in the carrier 60, or the chamber 121 in the carrier 120 where it is not necessary to have a clean air environment within the carrier 10, 60, or 120.

If desired, the carrier 10 or the carrier 120 could have centering ports or jets therein in a manner similar to that of the carrier 60. Of course, this would require either a third conduit or the shuttle valve 130 of FIG. 15 could connect to the centering ports.

An advantage of this invention is that it maintains a clean environment around an article. Another advantage of this invnetion is that an article can be supplied to or removed from an air slide or track without contamination thereof. A further advantage of this invention is that it does not require separate air means to eject or receive an article. Still another advantage of this invention is that it supports the article in a suspended position when the article is to be moved relative to the carrier. A still further advantage of this invention is that it allows a semiconductor wafer to be manually entered into and removed from an automatic wafer handling equipment without any human touching thereof. Yet another advantage of this invention is that only a single port in the carrier is needed for both exit or entry of the article.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A device for supplying an article to and receiving an article from an air slide or the like including:
 a portable carrier having a chamber in which the article is supported;
 means to detachably connect said carrier to the air slide;
 said carrier having means to receive pressurized air to selectively move an article between said carrier and the air slide when said detachably connecting means connects said carrier to the air slide;
 said receiving means including an air slide base in said chamber, said air slide base receiving pressurized air to support the article in suspended relation within said chamber when the article is to be moved into or out of said carrier;
 said chamber having a port;
 means to seal said port;
 and means to prevent said sealing means from being rendered ineffective unless said detachably connecting means has connected said carrier to the air slide.

2. The device according to claim 1 including means to retain the article in a fixed position within said chamber when the article is not to be moved into or out of said carrier.

3. The device according to claim 2 including means to simultaneously render said sealing means and said retaining means ineffective.

4. The device according to claim 3 in which said simultaneous rendering means includes means responsive to the pressurized air moving the article into or out of said carrier.

5. The device according to claim 3 in which said simultaneous rendering means includes means responsive to a vacuum.

6. The device according to claim 5 in which said retaining means includes means to retain the article in spaced relation to said air slide base.

7. The device according to claim 3 in which said retaining means includes means to retain the article in spaced relation to said air slide base.

8. The device according to claim 2 including:
 means to rotatably mount said sealing means;
 means to rotate said sealing means between its effective and ineffective positions;
 and said rotating means having means to cooperate with said retaining means to simultaneously render said retaining means ineffective when said sealing means is rendered ineffective.

9. The devive according to claim 8 in which:
 said retaining means includes:
 resilient means to engage the article and hold the article against said air slide base;
 means connected to said resilient means and supported by said carrier;
 and said cooperating means of said rotating means cooperates with said connected means of said retaining means to move said resilient means between its effective and ineffective positions.

10. The device according to claim 2 in which said retaining means includes means to retain the article in spaced relation to said air slide base.

11. A device for supplying an article to and receiving an article from an air slide or the like including:
 a portable carrier having a chamber in which the article is supported;
 means to detachably connect said carrier to the air slide;
 said carrier having means to receive pressurized air to selectively move an article between said carrier and the air slide when said detachably connecting means conects said carrier to the air slide;
 said receiving means including an air slide base in said chamber, said air slide base receiving pressurized air to support the article in suspended relation within said chamber when the article is to be moved into or out of said carrier;

means to retain the article in a fixed position within said chamber when the article is not to be moved into or out of said carrier;

and said retaining means including means to retain the article in spaced relation to said air slide base.

12. The device according to claim 1 in which said receiving means includes means to receive the pressurized air from the air slide.

* * * * *